United States Patent
Takamine

(10) Patent No.: US 11,606,081 B2
(45) Date of Patent: Mar. 14, 2023

(54) FILTER DEVICE AND METHOD FOR MANUFACTURING THE SAME

(71) Applicant: Murata Manufacturing Co., Ltd., Nagaokakyo (JP)

(72) Inventor: Yuichi Takamine, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 191 days.

(21) Appl. No.: 16/794,314

(22) Filed: Feb. 19, 2020

(65) Prior Publication Data

US 2020/0186127 A1 Jun. 11, 2020

Related U.S. Application Data

(63) Continuation of application No. PCT/JP2018/032630, filed on Sep. 3, 2018.

(30) Foreign Application Priority Data

Sep. 5, 2017 (JP) ............................. JP2017-170567

(51) Int. Cl.
*H03H 9/64* (2006.01)
*H03H 9/02* (2006.01)
*H03H 9/145* (2006.01)
*H03H 9/25* (2006.01)
*H03H 3/08* (2006.01)

(52) U.S. Cl.
CPC ............ *H03H 9/6489* (2013.01); *H03H 3/08* (2013.01); *H03H 9/02818* (2013.01); *H03H 9/145* (2013.01); *H03H 9/25* (2013.01)

(58) Field of Classification Search
CPC .......... H03H 9/02; H03H 9/0222; H03H 9/64; H03H 9/6483
See application file for complete search history.

(56) References Cited

U.S. PATENT DOCUMENTS

| | | | | |
|---|---|---|---|---|
| 5,471,178 A | * | 11/1995 | Hickernell | ........... H03H 9/6483 333/195 |
| 7,049,908 B2 | * | 5/2006 | Takata | ................. H03H 9/6483 333/194 |
| 7,741,931 B2 | * | 6/2010 | Matsuda | .............. H03H 9/0222 333/195 |

(Continued)

FOREIGN PATENT DOCUMENTS

| | | |
|---|---|---|
| JP | 2000-196409 A | 7/2000 |
| JP | 2003-060476 A | 2/2003 |

(Continued)

OTHER PUBLICATIONS

Official Communication issued in International Patent Application No. PCT/JP2018/032630, dated Nov. 13, 2018.

*Primary Examiner* — Samuel S Outten

(74) *Attorney, Agent, or Firm* — Keating & Bennett, LLP

(57) ABSTRACT

A filter device includes a substrate having piezoelectricity, a first filter including an IDT electrode disposed on the substrate, a terminal electrode disposed on the substrate, a first wiring electrode disposed on the substrate and connecting the first filter and a terminal electrode, and a dielectric film disposed above the substrate to cover the IDT electrode. At least a portion of the first wiring electrode is not covered with the dielectric film.

11 Claims, 11 Drawing Sheets

(56) References Cited

U.S. PATENT DOCUMENTS

| | | | |
|---|---|---|---|
| 8,222,972 B2* | 7/2012 | Inoue | H03H 9/02929 |
| | | | 333/133 |
| 2002/0190815 A1* | 12/2002 | Takamine | H03H 9/6436 |
| | | | 333/195 |
| 2007/0152774 A1* | 7/2007 | Nakanishi | H03H 3/02 |
| | | | 333/195 |
| 2010/0188165 A1 | 7/2010 | Nakamura et al. | |
| 2010/0231089 A1 | 9/2010 | Nakanishi et al. | |
| 2012/0019102 A1* | 1/2012 | Seki | H03H 3/10 |
| | | | 310/313 C |
| 2012/0182088 A1 | 7/2012 | Inoue et al. | |
| 2013/0029033 A1 | 1/2013 | Kikuchi et al. | |
| 2013/0106536 A1 | 5/2013 | Miura et al. | |
| 2016/0079957 A1 | 3/2016 | Kikuchi et al. | |
| 2016/0156331 A1 | 6/2016 | Miwa et al. | |
| 2017/0294896 A1 | 10/2017 | Nosaka | |
| 2017/0370791 A1 | 12/2017 | Nakamura et al. | |
| 2019/0140615 A1* | 5/2019 | Fujiya | H04B 1/38 |

FOREIGN PATENT DOCUMENTS

| | | |
|---|---|---|
| JP | 2009-021895 A | 1/2009 |
| JP | 2010-239613 A | 10/2010 |
| JP | 2012-147175 A | 8/2012 |
| JP | 2012-151697 A | 8/2012 |
| JP | 2018-006851 A | 1/2018 |
| WO | 2012/124210 A1 | 9/2012 |
| WO | 2012/157101 A1 | 11/2012 |
| WO | 2014/192614 A1 | 12/2014 |
| WO | 2015/022931 A1 | 2/2015 |
| WO | 2016/117676 A1 | 7/2016 |

* cited by examiner

FILTER DEVICE AND METHOD FOR MANUFACTURING THE SAME

CROSS REFERENCE TO RELATED APPLICATIONS

This application claims the benefit of priority to Japanese Patent Application No. 2017-170567 filed on Sep. 5, 2017 and is a Continuation Application of PCT Application No. PCT/JP2018/032630 filed on Sep. 3, 2018. The entire contents of each application are hereby incorporated herein by reference.

BACKGROUND OF THE INVENTION

1. Field of the Invention

The present invention relates to a filter device including an acoustic wave device and a method for manufacturing the same.

2. Description of the Related Art

Communication terminals in recent years are required to support a plurality of frequency bands and a plurality of radio systems by one terminal, that is, to achieve so-called multiband and multimode systems. To achieve these, one antenna is provided with a multiplexer that multiplexes harmonic signals at a plurality of radio carrier frequencies. As an example of this type of multiplexer, International Publication No. 2016/117676 discloses a filter device including a plurality of acoustic wave devices and LC devices and including a combination of a low pass filter and a band pass filter.

However, there is a problem in that, for example, in a case where the communication terminal handles both of frequency bands of the WiFi (registered trademark) band and Band 7 (Tx: 2500 to 2570 MHz; Rx: 2620 to 2690 MHz), an intermodulation distortion (IMD) or a harmonic wave distortion occurs in the filter device, and the reception sensitivity in Band 7 is thus deteriorated.

SUMMARY OF THE INVENTION

Preferred embodiments of the present invention reduce or prevent an IMD and a harmonic wave distortion in filter devices that each include an acoustic wave device.

A filter device according to a preferred embodiment of the present invention includes a substrate having piezoelectricity; a first filter including an IDT (inter digital transducer) electrode disposed on the substrate; a terminal electrode disposed on the substrate; a first wiring electrode disposed on the substrate and connecting the first filter and the terminal electrode; and a dielectric film disposed above the substrate to cover the IDT electrode. At least a portion of the first wiring electrode is not covered with the dielectric film.

As described above, the first wiring electrode connected to the terminal electrode is not covered with the dielectric film, and thus it is possible to reduce or prevent current flow from being obstructed in the first wiring electrode. This reduces or prevents the occurrence of an IMD and a harmonic wave distortion in the filter device.

The terminal electrode does not have to be covered with the dielectric film and may be connected to an antenna terminal.

This reduces or prevents the occurrence of an IMD and a harmonic wave distortion near the antenna terminal having high transmission power.

A filter device according to a preferred embodiment of the present invention may further include a second filter disposed on the substrate and including an IDT electrode different from the IDT electrode in the first filter; and a second wiring electrode disposed on the substrate and connecting the second filter and the terminal electrode. The IDT electrode in the second filter is covered with the dielectric film, and at least a portion of the second wiring electrode is not covered with the dielectric film.

As described above, the second wiring electrode connected to the terminal electrode is not covered with the dielectric film, and thus it is possible to reduce or prevent the current flow from being obstructed in the first wiring electrode. This reduces or prevents the occurrence of an IMD and a harmonic wave distortion in the filter device.

The entirety of each of the first wiring electrode and the second wiring electrode does not have to be covered with the dielectric film.

This further reduces or prevents the occurrence of an IMD and a harmonic wave distortion in the filter device.

A portion of the first wiring electrode and a portion of the second wiring electrode that are not covered with the dielectric film may respectively be in contact with an air layer.

As described above, the air layer having a lower dielectric constant than that of the dielectric film is brought into contact with the portions of the wiring electrodes that are not covered with the dielectric film, and thus it is possible to reduce or prevent current flow from being obstructed in the portions of the wiring electrodes that is not covered with the aforementioned dielectric film. This further reduces or prevents the occurrence of an IMD and a harmonic wave distortion in the filter device.

The cover layer may be disposed above the first wiring electrode and the second wiring electrode, and the air layer may be disposed between the cover layer and the first wiring electrode and between the cover layer and the second wiring electrode.

As described above, the air layer is disposed between each wiring electrode and the cover layer, and thus it is possible to reliably bring the air layer into contact with the wiring electrodes. It is also possible to prevent a foreign material other than the air layer from being brought into contact with the wiring electrodes as much as possible and is possible to reduce or prevent current flow from being obstructed in the wiring electrodes. This reduces or prevents the occurrence of an IMD and a harmonic wave distortion in the filter device.

Each of the IDT electrode in the first filter and the IDT electrode in the second filter may have a comb shape and may include a plurality of electrode fingers and a busbar electrode connected to the plurality of electrode fingers.

The dielectric film for each IDT electrode including the electrode fingers and the busbar electrode is provided. Accordingly, it is possible to reliably maintain the IDT electrode moisture-resistant and to reduce or prevent the occurrence of an IMD and a harmonic wave distortion in the filter device.

The dielectric film may include silicon oxide.

As described above, the wiring electrodes connected to the terminal electrode are not covered with the dielectric film. Even in the case where the dielectric film includes silicon oxide, it is possible to reduce or prevent current flow from being obstructed in the wiring electrodes. This reduces or prevents the occurrence of an IMD and a harmonic wave distortion in the filter device.

A method for manufacturing a filter device according to a preferred embodiment of the present invention includes forming, on a substrate having piezoelectricity, a first filter including an IDT electrode, a terminal electrode connected to an antenna terminal, and a wiring electrode connecting the first filter and the terminal electrode; forming a dielectric film above the substrate to cover the IDT electrode, the terminal electrode, and the wiring electrode; and removing portions of the dielectric film, the portions being respectively located on the terminal electrode and the wiring electrode.

This enables the portion not covered with the dielectric film to be formed on the wiring electrode connected to the terminal electrode with high accuracy. Forming the portions not covered with the dielectric film with high accuracy reduces or prevents the occurrence of an IMD and a harmonic wave distortion in the filter device.

A method for manufacturing a filter device according to a preferred embodiment of the present invention that includes a substrate having piezoelectricity, a first filter and a terminal electrode that are disposed on the substrate, and a wiring electrode disposed on the substrate and connecting the first filter and the terminal electrode includes forming the first filter and a lower wiring layer on the substrate, the first filter including an IDT electrode, the lower wiring layer being a thick portion included in the wiring electrode; forming a dielectric film above the substrate to cover the IDT electrode and the lower wiring layer; removing portions of the dielectric film, the portions respectively corresponding to the terminal electrode to be formed and an upper wiring layer to be formed as a remaining thick portion included in the wiring electrode; and forming the upper wiring layer and the terminal electrode in areas respectively corresponding to the removed portions of the dielectric film.

This enables the portions not covered with the dielectric film to be formed on the wiring electrode. Forming the portions not covered with the dielectric film with high accuracy reduces or prevents the occurrence of an IMD and a harmonic wave distortion in the filter device.

A filter device according to a preferred embodiment of the present invention includes a substrate having piezoelectricity; a first filter including an acoustic wave device disposed on the substrate; a terminal electrode disposed on the substrate; a first wiring electrode disposed on the substrate and connecting the first filter and the terminal electrode; and a dielectric film disposed above the substrate to cover the acoustic wave device. At least a portion of the first wiring electrode is not covered with the dielectric film.

As described above, the first wiring electrode connected to the terminal electrode is exposed, and thus it is possible to reduce or prevent the current flow from being obstructed in the first wiring electrode. This reduces or prevents the occurrence of an IMD and a harmonic wave distortion in the filter device.

In preferred embodiments of the present invention, the filter devices each reduce or prevent an IMD and a harmonic wave distortion.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

1. Background of Preferred Embodiments of the Present Invention

Figure 1:
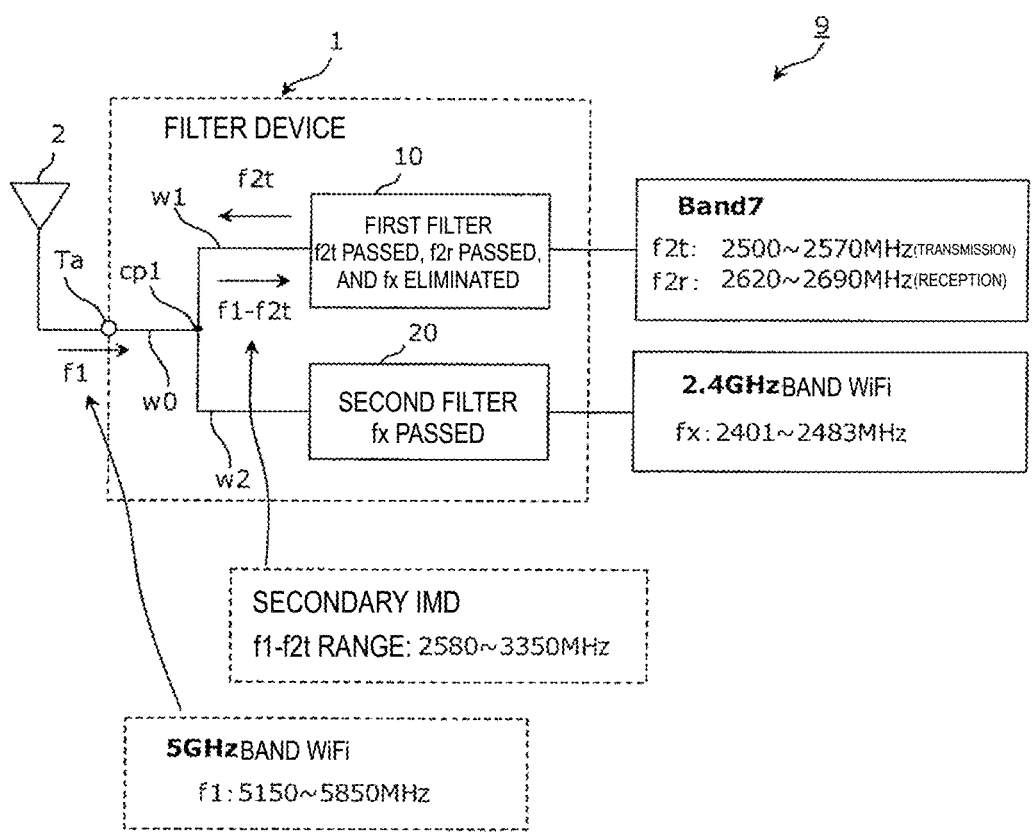
FIG. 1 is a diagram of the basic circuit configuration of a filter device according to a preferred embodiment of the present invention.

First, the background of preferred embodiments of the present invention will be described with reference to FIG. 1. FIG. 1 is a diagram of the basic circuit configuration of a filter device 1 according to a preferred embodiment of the present invention.

The filter device 1 includes a first filter 10 and a second filter 20. The first filter 10 is connected to an antenna terminal Ta with a wiring line w1 and a wiring line w0 interposed therebetween. The second filter 20 is connected to the antenna terminal Ta with a wiring line w2 and the wiring line w0 interposed therebetween. The first filter 10 and the second filter 20 are mutually connected at a connection point cp1 where the wiring line w1 and the wiring line w2 are connected.

The first filter 10 and the second filter 20 preferably include an acoustic wave device such as, for example, a SAW (surface acoustic wave) filter, and the acoustic wave device includes an IDT (interdigital transducer) electrode. The wiring lines w0 to w2 are each defined by a wiring electrode.

The filter device 1 is installed in a communication apparatus 9 that is communication equipment, such as a mobile phone, for example. The filter device 1 is preferably, for example, a multiplexer that multiplexes signals in 2.4 GHz band WiFi, a middle band, and a high band. In the filter device 1, for example, harmonic signals in Band 7 (transmission frequency f2t: about 2500 MHz to about 2570 MHz; reception frequency f2r: about 2620 MHz to about 2690 MHz) are input to and output from the first filter 10, and harmonic signals in 2.4 GHz band WiFi (frequency fx: about 2401 MHz to about 2483 MHz) are input to and output from the second filter 20. Specifically, the first filter 10 passes harmonic signals at the frequency f2t and the frequency f2r therethrough, and the second filter 20 passes the harmonic signals at the frequency fx therethrough. Note that the first filter 10 includes a band elimination filter that stops a harmonic signal at the frequency fx from passing therethrough.

In the filter device 1 having the basic configuration illustrated FIG. 1, a signal, for example, in 5 GHz WiFi (frequency f1: about 5150 MHz to about 5850 MHz) output from a different antenna terminal in the same communication equipment and input to the antenna terminal Ta and a signal with the transmission frequency f2t in Band 7 output via the first filter 10 might cause the occurrence of an intermodulation distortion (IMD).

In particular, it is conceived that in a case where the filter device 1 includes a piezoelectric substrate having nonlinearity in an input-output relationship, an IMD easily occurs from a routing line disposed on the piezoelectric substrate. It is also conceived that an IMD easily occurs near the antenna terminal Ta because high power is transmitted through the wiring lines w0 to w2 connected to the antenna terminal Ta at the time of propagating a transmission signal. In addition, it is conceived that a distortion, such as an IMD, for example, occurs easily for the following reason. To improve temperature characteristics or moisture resistance, a dielectric film preferably including, for example, $SiO_2$ is provided on the IDT electrode included in an acoustic wave device. The dielectric film is provided on not only IDT electrodes but also the wiring electrodes defining wiring lines w0 to w2. When a harmonic signal propagates through a wiring electrode, current concentrates on a portion near the surface of the wiring electrode, and thus, for example, contact of a foreign material, such as a dielectric film, for example, with the surface of the wiring electrode obstructs current flow.

The frequencies of IMDs occurring in these cases are those of, for example, a secondary IMD (f1-f2t) (frequency: about 2580 MHz to about 3350 MHz), and the frequency of the IMD (f1-f2t) partially matches the reception frequency f2r in Band 7. Accordingly, the IMD (f1-f2t) occurring is not eliminated by the first filter 10 but passes therethrough. This deteriorates the reception sensitivity in Band 7.

The filter device 1 of the present preferred embodiment has a configuration in which, for example, at least one of a portion of a wiring electrode between the antenna terminal Ta and the first filter 10 and a portion of a wiring electrode between the antenna terminal Ta and the second filter 20 is not covered with a dielectric film in order to reduce or prevent the occurrence of a distortion such as an IMD.

Hereinafter, preferred embodiments of the present invention will be described in detail with reference to the drawings. Note that the preferred embodiments described below illustrates a comprehensive or specific example. Numerical values, shapes, materials, components, the arrangement and connection structure of the components, and the like described in the following preferred embodiments are each examples and are not intended to limit the present invention. Among the components in the following preferred embodiments, a component that is not described in an independent claim is described as an optional component. The sizes and the ratio of the sizes of components in the drawings are not necessarily precisely illustrated.

2. Filter Device Configuration

Figure 2:
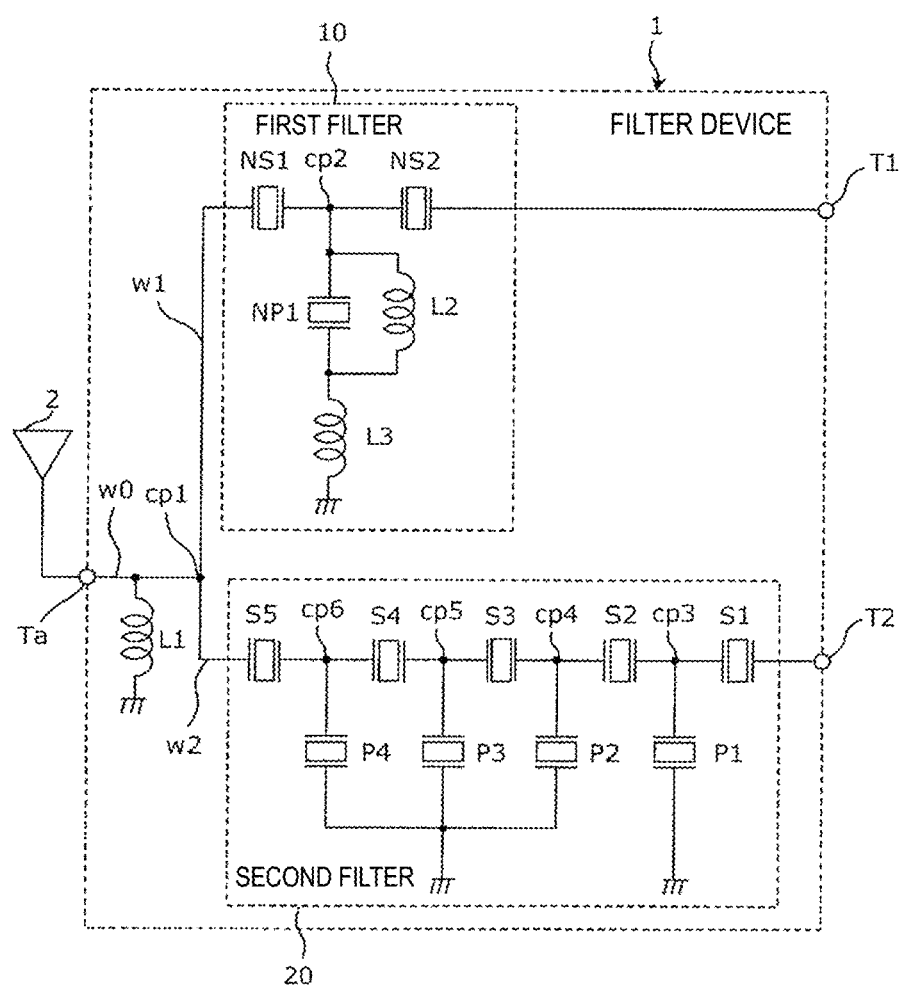
FIG. 2 is a diagram of a specific circuit configuration of a filter device according to a preferred embodiment of the present invention.

The configuration of the filter device 1 according to the present preferred embodiment will be described with reference to FIG. 2. FIG. 2 is a diagram of a specific circuit configuration of the filter device 1.

The filter device 1 includes the antenna terminal Ta connected to an antenna 2, a first terminal T1 disposed on an opposite side of the first filter 10 from the antenna terminal Ta, and a second terminal T2 disposed on an opposite side of the second filter 20 from the antenna terminal Ta. For example, the first terminal T1 is a terminal connected to a signal processing circuit for Band 7, and the second terminal T2 is a terminal connected to a signal processing circuit for 2.4 GHz band WiFi.

Specifically, the first filter 10 is disposed on a path connecting the antenna terminal Ta and the first terminal T1, and the second filter 20 is disposed on a path connecting the antenna terminal Ta and the second terminal T2. The first filter 10 and the second filter 20 are mutually connected at the connection point cp1. In addition, an inductor L1 is shunt connected between the antenna terminal Ta and the connection point cp1.

The first filter 10 includes series resonators NS1 and NS2. Each of the series resonators NS1 and NS2 is disposed on a path between the first terminal T1 and the connection point cp1. The first filter 10 also includes a parallel resonator NP1 and an inductor L2 connected parallel to the parallel resonator NP1. The parallel resonator NP1 is connected to a connection point cp2 between the series resonators NS1 and NS2 at one end and is connected to a ground at the other end with an inductor L3 interposed therebetween.

The second filter 20 includes series resonators S1, S2, S3, S4, and S5. Each of the series resonators S1 to S5 is disposed on a path between the second terminal T2 and the connection point cp1. The second filter 20 also includes parallel resonators P1, P2, P3, and P4. The parallel resonator P1 is connected to a connection point cp3 between the series resonators S1 and S2 at one end and is connected to a ground at the other end. The parallel resonator P2 is connected to a connection point cp4 between the series resonators S2 and S3 at one end, the parallel resonator P3 is connected to a connection point cp5 between the series resonators S3 and S4 at one end, and the parallel resonator P4 is connected to a connection point cp6 between the series resonators S4 and S5 at one end. The parallel resonators P2 to P4 are connected together at the other end and are connected to a ground.

The series resonators NS1, NS2, and S1 to S5 and the parallel resonators NP1 and P1 to P4 are preferably, for example, acoustic wave devices and include IDT electrodes.

Figure 3:
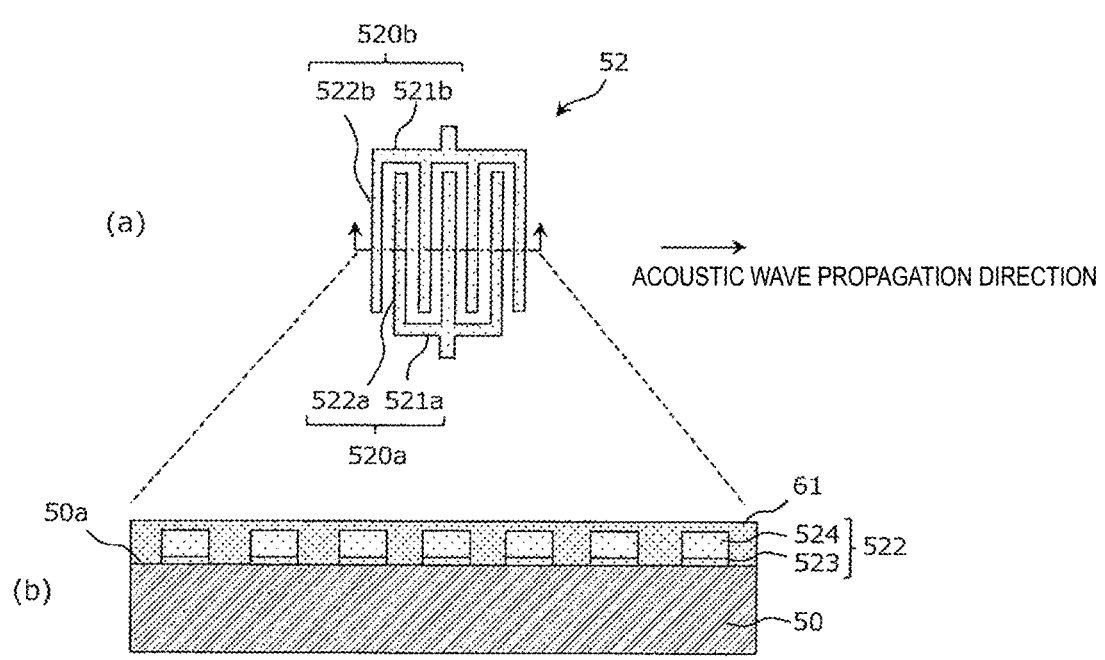
FIG. 3 is a view schematically illustrating an IDT electrode included in an acoustic wave device of a filter device according to a preferred embodiment of the present invention.

IDT electrodes 52 included in the acoustic wave devices will be described with reference to FIG. 3. FIG. 3 is a view schematically illustrating each IDT electrode 52 included in the corresponding acoustic wave device. Part (a) of FIG. 3 is a cross-sectional view, and part (b) of FIG. 3 is a plan view. Note that the IDT electrode 52 is intended to explain a typical structure of an acoustic wave device, and the number of electrode fingers included in an electrode, the length, and the like are not limited to those of the IDT electrode 52.

As illustrated in part (a) of FIG. 3, the IDT electrode 52 has a comb shape and includes a pair of IDT electrodes 520a and 520b facing each other. The IDT electrode 520a includes a plurality of electrode fingers 522a parallel or substantially parallel to each other and a busbar electrode 521a connecting the plurality of electrode fingers 522a. The IDT electrode 520b includes a plurality of electrode fingers 522b parallel or substantially parallel to each other and a busbar electrode 521b connecting the plurality of electrode fingers 522b. The plurality of electrode fingers 522a and 522b extend in a direction orthogonal or substantially orthogonal to an acoustic wave propagation direction. That is, the electrode fingers 522a and 522b are side by side in the acoustic wave propagation direction. Hereinafter, at least one or all of the busbar electrodes 521a and 521b are each referred to as a busbar electrode 521 in some cases. In addition, at least one or all of the electrode fingers 522a and 522b are referred to as electrode fingers 522 in some cases.

As illustrated in part (b) of FIG. 3, the IDT electrode 52 is disposed on a main surface 50a of a substrate 50. The IDT electrode 52 includes a close contact layer 523 and a main electrode layer 524 that are stacked. For example, for the close contact layer 523, Ti (12 nm thick) is preferably used. For example, the main electrode layer 524 is preferably made of a metal such as Ti, Al, Cu, Au, Pt, Ag, Pd, or Ni, an alloy of any of the metals, or a layered product of the metals or alloys thereof. For the main electrode layer 524 in the present preferred embodiment, Al (for example, about 162 nm thick) including about 1% Cu is preferably used, for example. A dielectric film 61 is a protective film preferably including, for example, silicon dioxide as a main ingredient and covers the IDT electrode 52. The dielectric film 61 is preferably, for example, about 25 nm thick. The dielectric film 61 may preferably be a protective film including, for example, silicon nitride as a main ingredient. The substrate 50 is preferably made of, for example, a LiTaO$_3$ piezoelectric single crystal, a LiNbO$_3$ piezoelectric single crystal, or a piezoelectric ceramic.

Figure 4A:
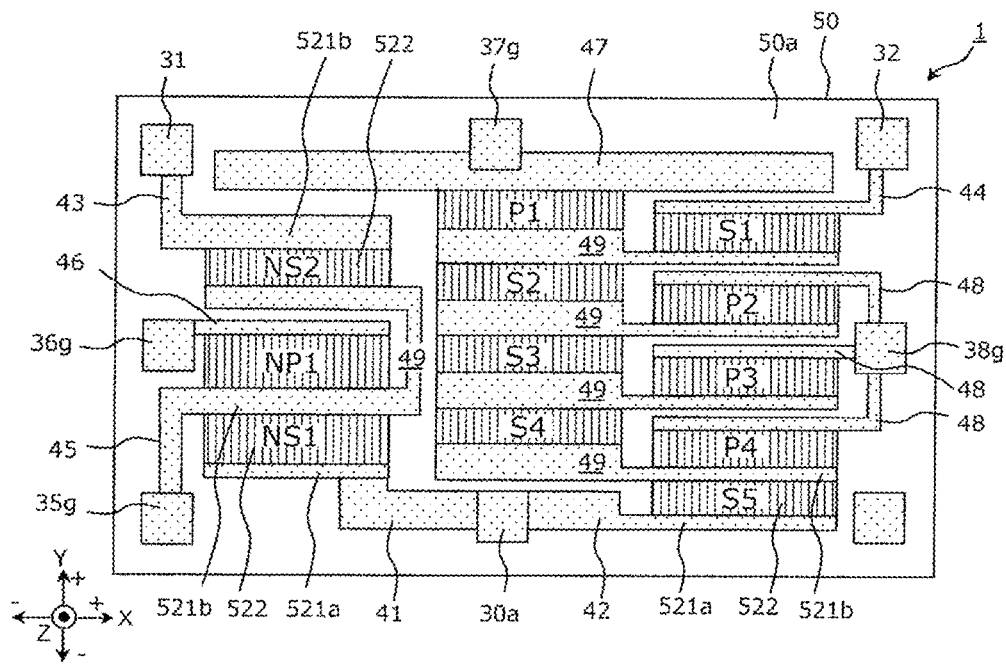
FIG. 4A is a plan view illustrating the layout of electrodes of a filter device according to a preferred embodiment of the present invention and a state before a dielectric film is disposed on the electrodes.

A specific structure of the filter device 1 will be described with reference to FIGS. 4A and 4B. FIG. 4A is a plan view illustrating the layout of the electrodes of the filter device 1 and a state before the dielectric film 61 is disposed on the electrodes.

In FIG. 4A, a wiring electrode 41 corresponds to the wiring line w1 illustrated in FIG. 2, a wiring electrode 42 corresponds to the wiring line w2 illustrated in FIG. 2, and a terminal electrode 30a corresponds to the connection point cp1 illustrated in FIG. 2. Hereinafter, the arrangement and the like of the resonators S1 to S5, P1 to P4, NS1, NS2, and NP1 will be described. Note that a busbar electrode located on the negative side of the Y axis and a busbar electrode located on the positive side of the Y axis when viewed from the electrode fingers 522 of the IDT electrode 52 in FIG. 4A are respectively referred to as one busbar electrode and the other busbar electrode in some cases.

As illustrated in FIG. 4A, the series resonators NS1 and NS2, the parallel resonator NP1, the series resonators S1 to S5, and the parallel resonators P1 to P4 are provided on the substrate 50, the series resonators NS1 and NS2 and the parallel resonator NP1 being included in the first filter 10, the series resonators S1 to S5 and the parallel resonators P1 to P4 being included in the second filter 20. On the substrate 50, the terminal electrode 30a connected to the antenna terminal Ta, an input/output electrode 31 connected to the first terminal T1, an input/output electrode 32 connected to the second terminal T2, and four ground electrodes 35g, 36g, 37g, and 38g respectively connected for four ground terminals are also provided. The terminal electrode 30a, the input/output electrodes 31 and 32, and the ground electrodes 35g to 38g are each disposed near the outer periphery of the substrate 50.

In FIG. 4A, the IDT electrodes 52 included in the series resonators NS1 and NS2 and the parallel resonator NP1 are disposed in an area on the left side of the substrate 50 (negative side of the X axis). The one busbar electrode 521a of the IDT electrode of the series resonator NS1 is connected to the terminal electrode 30a with the first wiring electrode 41 interposed therebetween, and the other busbar electrode 521b of the series resonator NS1 is connected to the ground electrode 35g with a wiring electrode 45 interposed therebetween. The one busbar electrode of the IDT electrode 52 of the series resonator NS2 is connected to the other busbar electrode 521b with a wiring electrode 49 interposed therebetween, and the other busbar electrode of the series resonator NS2 is connected to the input/output electrode 31 with a wiring electrode 43 interposed therebetween.

The one busbar electrode of the IDT electrode 52 of the parallel resonator NP1 is connected to the other busbar electrode 521b of the series resonator NS1, and the other busbar electrode of the parallel resonator NP1 is connected to the ground electrode 36g with a wiring electrode 46 interposed therebetween.

Note that the inductors L1 to L3 illustrated in FIG. 2 may be disposed on a cover layer 66 (described later) (not illustrated in FIG. 2) or may be disposed on a substrate different from the substrate 50.

In FIG. 4A, the IDT electrodes 52 respectively included in the series resonators S1 to S5 and the parallel resonators P1 to P4 are disposed in a central and right (positive side of the X axis) area of the substrate 50. The one busbar electrode of the IDT electrode 52 of the series resonator S1 is connected to the other busbar electrode of the series resonator S2, and the other busbar electrode of the series resonator S1 is connected to the input/output electrode 32 with a wiring electrode 44 interposed therebetween. The one busbar electrode of the IDT electrode 52 of the series resonator S2 is connected to the other busbar electrode of the series resonator S3, and the other busbar electrode of the series resonator S2 is connected to the one busbar electrode of the series resonator S1. The one busbar electrode of the IDT electrode 52 of the series resonator S3 is connected to the other busbar electrode of the series resonator S4, and the other busbar electrode of the series resonator S3 is connected to the one busbar electrode of the series resonator S2. The one busbar electrode of the IDT electrode 52 of the series resonator S4 is connected to the other busbar electrode 521b of the series resonator S5, and the other busbar electrode of the series resonator S4 is connected to the one busbar electrode of the series resonator S3. The one busbar electrode 521a of the IDT electrode 52 of the series resonator S5 is connected to the terminal electrode 30a with a second wiring electrode 42 interposed therebetween, and the other busbar electrode 521b of the series resonator S5 is connected to the one busbar electrode of the series resonator S4.

In addition, the one busbar electrode of the IDT electrode 52 of the parallel resonator P1 is connected to the one busbar electrode of the series resonator S1 with a wiring electrode 49 interposed therebetween, and the other busbar electrode of the parallel resonator P1 is connected to the ground electrode 37g with a wiring electrode 47 interposed therebetween. The one busbar electrode of the IDT electrode 52 of the parallel resonator P2 is connected to the one busbar electrode of the series resonator S2 with a wiring electrode 49 interposed therebetween, and the other busbar electrode of the parallel resonator P2 is connected to the ground electrode 38g with a wiring electrode 48 interposed therebetween. The one busbar electrode of the IDT electrode 52 of the parallel resonator P3 is connected to the one busbar electrode of the series resonator S3 with a wiring electrode 49 interposed therebetween, and the other busbar electrode of the parallel resonator P3 is connected to the ground electrode 38g with the wiring electrode 48 interposed therebetween. The one busbar electrode of the IDT electrode 52 of the parallel resonator P4 is connected to the one busbar electrode of the series resonator S4 with a wiring electrode 49 interposed therebetween, and the other busbar electrode of the parallel resonator P4 is connected to the ground electrode 38g with a wiring electrode 48 interposed therebetween.

Figure 4B:
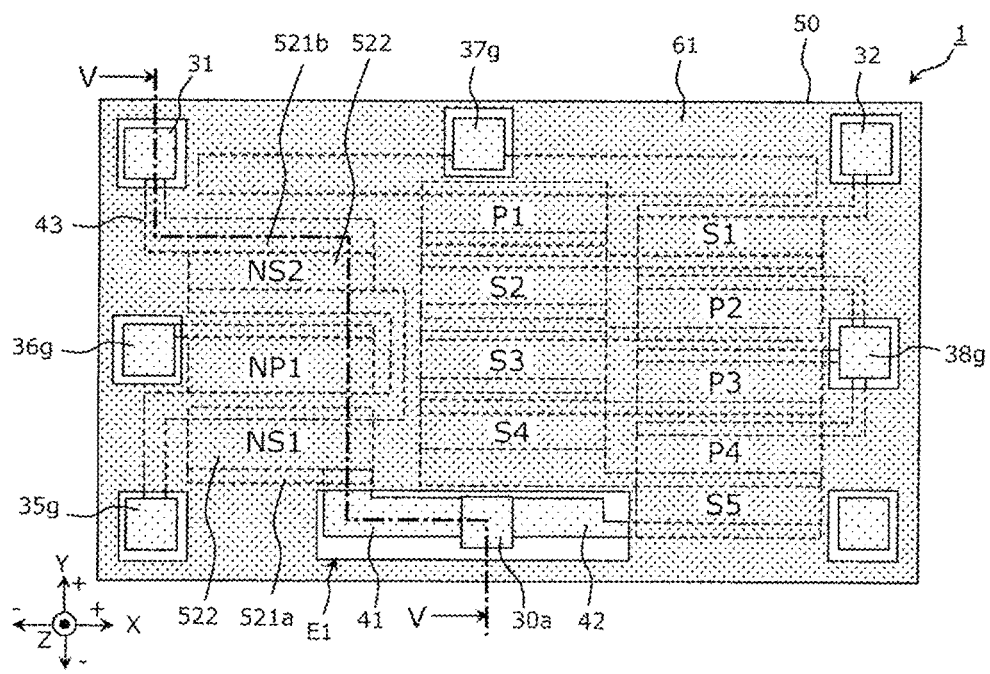
FIG. 4B is a plan view illustrating the layout of electrodes of a filter device according to a preferred embodiment of the present invention and a state where the dielectric film is disposed and a portion of the wiring electrodes is exposed.

FIG. 4B is a plan view illustrating the layout of the electrodes of the filter device 1 and a state where the dielectric film 61 is disposed and a portion of the wiring electrodes 41 and 42 is exposed.

As illustrated in FIG. 4B, the dielectric film 61 is provided above the main surface 50a of the substrate 50 so as to cover each IDT electrode 52 in the corresponding resonator included in the corresponding filter. Specifically, the dielectric film 61 is disposed so as to cover the electrode fingers 522 and the busbar electrode 521 of the IDT electrode 52, the main surface 50a of the substrate 50, and the wiring electrodes 43 to 49. In the present preferred embodiment, a portion of the first wiring electrode 41 and a portion of the second wiring electrode 42 are not covered with the dielectric film 61 and are exposed. In other words, the first wiring electrode 41 and the second wiring electrode 42 respectively include exposed portions E1 not covered with the dielectric film 61. Note that the wiring electrodes 43 to 48 respectively include portions not covered with the dielectric film near the input/output electrodes 31 and 32 and the ground electrodes 35g to 38g. However, these portions not covered with the dielectric film 61 are covered with a support layer 65 (described later) and thus are in an unexposed configuration.

Figure 5:
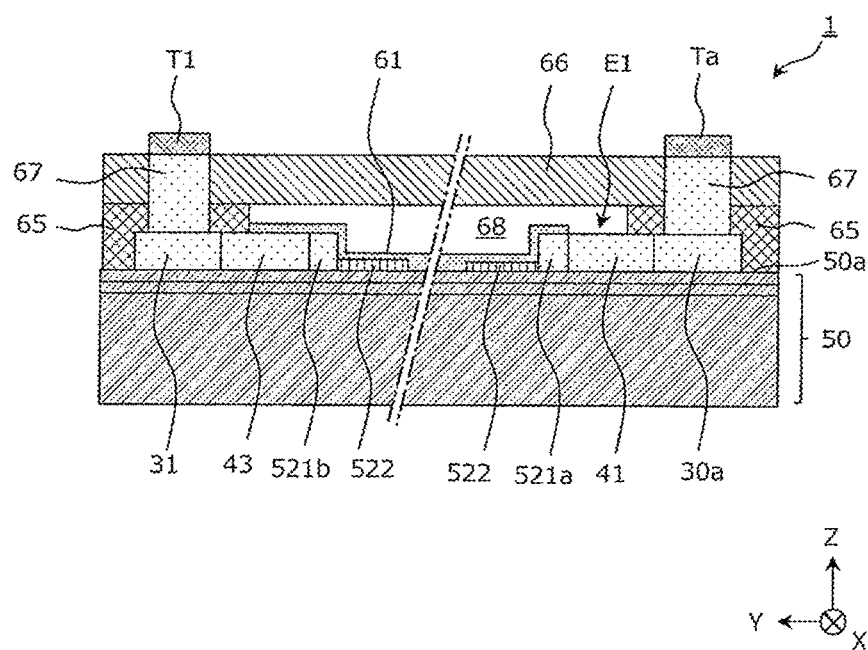
FIG. 5 is a view schematically illustrating a cross section of a filter device according to a preferred embodiment of the present invention divided along the V-V line in FIG. 4B.

Locations where the dielectric film 61 and the exposed portions E1 are disposed will then be described with reference to the cross-sectional view in FIG. 5. FIG. 5 is a view schematically illustrating a cross section of the filter device 1 divided along the V-V line in FIG. 4B.

As illustrated in FIG. 5, the filter device 1 includes the IDT electrode 52, the wiring electrodes 41 and 43, the terminal electrode 30a, and the input/output electrode 31. The filter device 1 also includes the substrate 50, the support layer 65, the cover layer 66, and via electrodes 67.

As described above, the substrate 50 is made of, for example, a LiTaO$_3$ piezoelectric single crystal, a LiNbO$_3$ piezoelectric single crystal, or a piezoelectric ceramic. In the present preferred embodiment, the substrate 50 preferably includes, for example, a LiTaO$_3$ piezoelectric layer (about 600 nm thick, for example) having a cut-angle of about 50°, a SiO$_2$ layer (about 670 nm thick, for example) that is a low acoustic velocity film, and a supporting substrate (about 200 µm thick, for example) including a Si material, from the top in this order. The supporting substrate also defines and functions as a high acoustic velocity film.

The support layer 65 is thicker than the IDT electrode and the wiring electrodes 41 to 49 and is provided upright around an area including the IDT electrodes 52 on the main surface 50a of the substrate 50. The support layer 65 is preferably made of, for example, a material including at least one of, for example, polyimide, epoxy, benzocyclobutene (BCB), polybenzoxazole (PBO), resin, and silicon oxide.

The cover layer 66 is preferably made of, for example, a material including at least one of polyimide, epoxy, BCB, PBO, resin, and silicon oxide. The cover layer 66 is disposed on the support layer 65 and covers the IDT electrodes 52 with an air layer 68 interposed therebetween. The air layer 68 surrounded by the substrate 50, the support layer 65 provided upright in a perimeter portion of the substrate 50, and the cover layer 66 disposed on the support layer 65 are provided in the filter device 1 in this manner. The dielectric constant of the air layer 68 is lower than the dielectric constant of the dielectric film 61. Accordingly, for example, in a case where there is the air layer 68 on the wiring electrodes 41 and 42, the flow of a harmonic signal propagating the wiring electrodes 41 and 42 is less likely to be obstructed, and an IMD or the like is less likely to occur.

Each via electrode 67 is a columnar electrode that penetrates the support layer 65 and the cover layer 66 and is a wiring path connecting the wiring electrodes 41 to 48 and the external terminals (the antenna terminal Ta, the first terminal T1, a second terminal T3, and the ground terminals).

Each IDT electrode 52 excites an acoustic wave and is disposed on the main surface 50a of the substrate 50. Note that a silicon dioxide thin film or the like may be provided between the substrate 50 and the IDT electrode 52.

The above-described dielectric film 61 is provided on the electrode fingers 522 and the busbar electrode 521 of the IDT electrode 52. The busbar electrode 521 is thicker than the electrode fingers 522 for low electrical resistance. Similarly, the wiring electrodes 41 and 43, the terminal electrode 30a, and the input/output electrode 31 are thicker than the electrode fingers 522 so as to have low electrical resistance.

As illustrated on the left side of the break line in FIG. 5 (positive side of the Y axis), the busbar electrode 521b of the IDT electrode 52 of the series resonator NS2 is connected to the input/output electrode 31 with the wiring electrode 43 interposed therebetween. The input/output electrode 31 is connected to the first terminal T1 with the via electrode 67 interposed therebetween. On the wiring electrode 43, the dielectric film 61 is formed.

As illustrated on the right side of the break line in FIG. 5 (negative side of the Y axis), the busbar electrode 521a of the IDT electrode 52 of the series resonator NS1 is connected to the terminal electrode 30a with the wiring electrode 41 interposed therebetween. The terminal electrode 30a is connected to the antenna terminal Ta with the via electrode 67 interposed therebetween. In this preferred embodiment as described above, the dielectric film 61 is not formed on the wiring electrode 41, and the wiring electrode 41 is exposed. That is, the filter device 1 has a structure in which the wiring electrode 43 disposed on the opposite side from the antenna terminal Ta does not have the exposed portion E1 but the wiring electrode 41 disposed on the antenna terminal Ta side has the exposed portion E1.

3. Method for Manufacturing Filter Device

Figure 6:
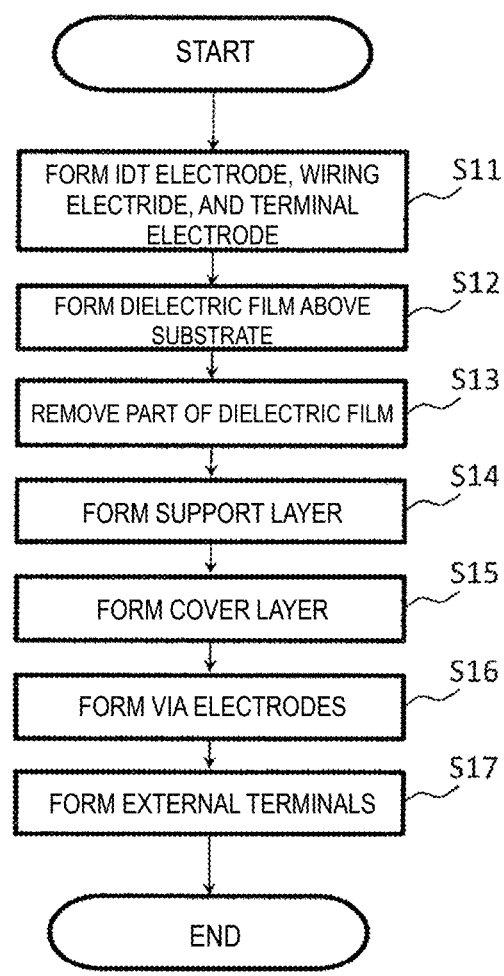
FIG. 6 is a flowchart illustrating a method for manufacturing a filter device according to a preferred embodiment of the present invention.

A non-limiting example of a method for manufacturing the filter device 1 according to the present preferred embodiment will be described with reference to FIGS. 6 and 7. FIG. 6 is a flowchart illustrating a method for manufacturing the filter device 1. FIGS. 7A to 7C are views schematically illustrating a portion of the method for manufacturing the filter device 1. In this example, a case where a LiTaO$_3$ piezoelectric substrate is used as the substrate 50 is described. In this example, of the first filter 10 and the second filter 20, the first filter 10 is taken as an example to describe the method for manufacturing the filter device 1.

Figure 7A:
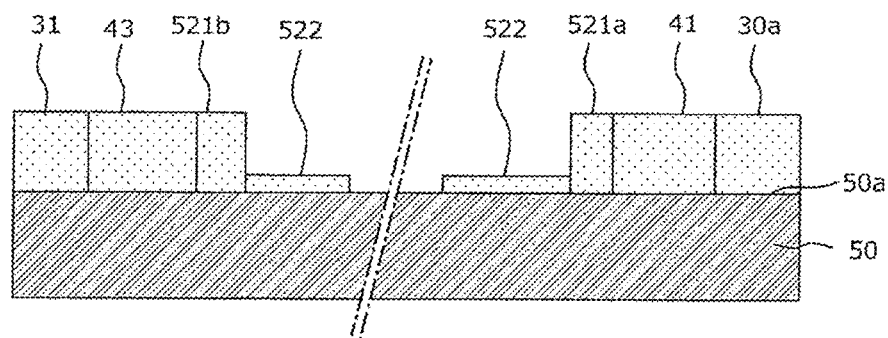
FIGS. 7A to 7C are views schematically illustrating a portion of a method for manufacturing a filter device according to a preferred embodiment of the present invention.

First, as illustrated in FIG. 7A, the first filter 10 including the IDT electrodes 52, the terminal electrode 30a, and the wiring electrode 41 are formed on the substrate 50 (S11). After the film deposition of the electrode fingers 522, additional film deposition of the terminal electrode 30a and the wiring electrode 41 is further performed for low electrical resistance.

Figure 7B:
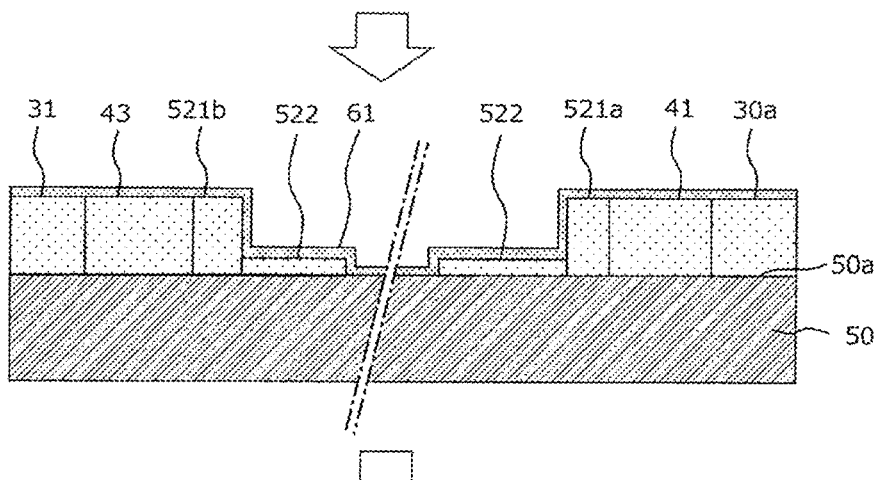

As illustrated in FIG. 7B, the dielectric film 61 is subsequently formed on the entire or substantially the entire surface of the main surface 50a of the substrate 50 so as to cover the IDT electrodes 52, the terminal electrode 30a, and the wiring electrode 41 (S12). The dielectric film 61 is formed by, for example, spattering or vapor deposition.

Figure 7C:
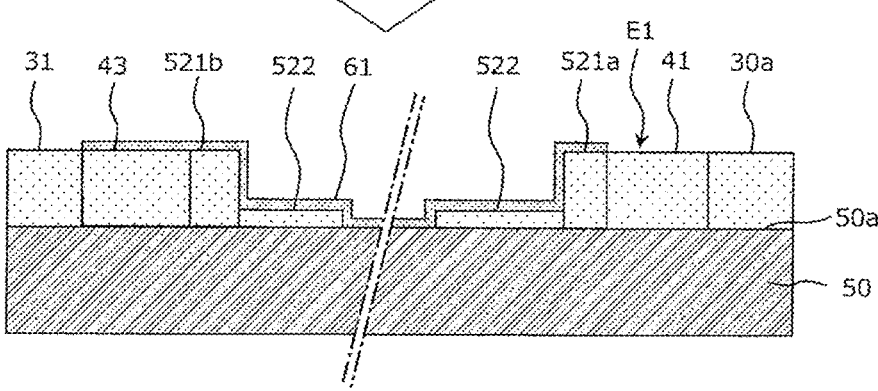

As illustrated in FIG. 7C, a portion of the dielectric film 61 formed above the substrate 50 is subsequently removed (S13). Specifically, portions of the dielectric film 61 are removed by etching, the portions respectively formed on the terminal electrode 30a and the wiring electrode 41. The exposed portion E1 is thus formed on the wiring electrode 41.

Subsequently, the support layer 65 is formed on the substrate 50 (S14). The support layer 65 is formed, for example, by applying resin to the substrate 50. Specifically, the support layer 65 is disposed on the main surface 50a of the substrate 50 by photolithography.

Subsequently, the cover layer 66 is formed on the support layer 65 (S15). The cover layer 66 is preferably, for example, a sheet-shaped polyimide resin and is attached to the support layer 65 by bonding (not illustrated). The air layer 68 is thus formed between each IDT electrode 52 and the cover layer 66.

Subsequently, a plurality of via electrodes 67 are formed in the support layer 65 and the cover layer 66 (S16). Specifically, via holes are formed in the support layer 65 and the cover layer 66, and thereafter the via holes are filled with a conductive material. The via electrodes 67 are thus formed. The via holes may be formed by photolithography or laser machining, for example. The conductive material may be embedded in the via holes by such a method as plating, vapor deposition, or spattering, for example.

Subsequently, external terminals are formed on the plurality of via electrodes 67 (S17). Specifically, the antenna terminal Ta, the first terminal T1, the second terminal T2, and the ground terminals are respectively formed for the plurality of via electrodes 67. The filter device 1 is formed by a process represented by these steps S11 to S17.

4. Advantageous Effects and the Like

Figure 8:
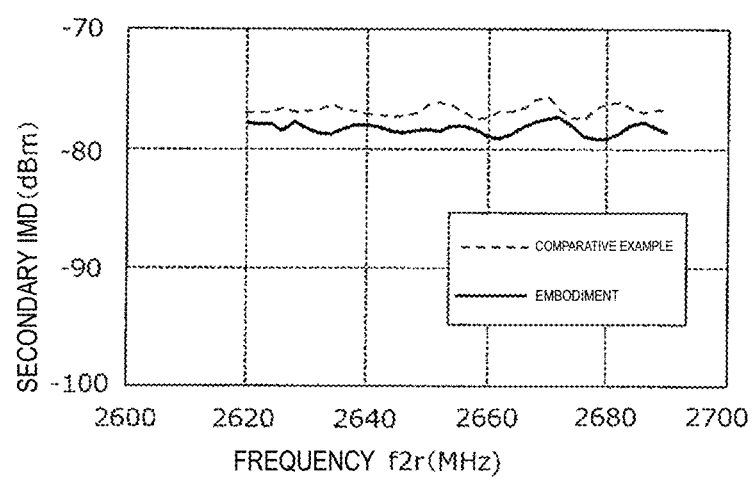
FIG. 8 is a graph illustrating a secondary IMD (intermodulation distortion) occurring in a filter device of a preferred embodiment of the present invention.

The advantageous effects of the filter device 1 of the present preferred embodiment will be described with reference to FIG. 8. FIG. 8 is a graph illustrating a secondary IMD occurring in the filter device 1. "Preferred embodiment" in FIG. 8 represents the filter device 1 having the above-described configuration. "Comparative example" in FIG. 8 is an example in which the entirety of each of the wiring electrodes 41 and 42 is covered with the dielectric film 61. Note that in the comparative example, the wiring electrodes 41 and 42 are directly on the substrate 50.

The range of frequencies measured in the present preferred embodiment and the comparative example is the same as that of the reception frequency f2r in Band 7. An approximately 23 dBm signal is input into the first terminal T1 as a signal in Band 7, and an approximately 5 dBm signal is input into the antenna terminal Ta as a signal in 5 GHz band WiFi. Secondary IMDs output to the first terminal T1 due to these signals are then measured.

As illustrated in FIG. 8, secondary IMDs in the present preferred embodiment are lower as a whole than those in the comparative example and are about 2 dBm lower in average.

The filter device 1 according to the present preferred embodiment includes the substrate 50 having piezoelectricity, the first filter 10 including the IDT electrodes 52 disposed on the substrate 50, the terminal electrode 30a disposed on the substrate 50, the first wiring electrode 41 disposed on the substrate 50 and connecting the first filter 10 and the terminal electrode 30a, and the dielectric film 61 disposed above the substrate 50 so as to cover the IDT electrodes 52. At least a portion of the first wiring electrode 41 is not covered with the dielectric film 61 and is exposed. As described above, exposing the first wiring electrode 41 connected to the terminal electrode 30a reduces or prevents current flow from being obstructed in the first wiring electrode 41. This reduces or prevents the occurrence of an IMD and a harmonic wave distortion in the filter device 1.

5. Modification 1

Figure 9:
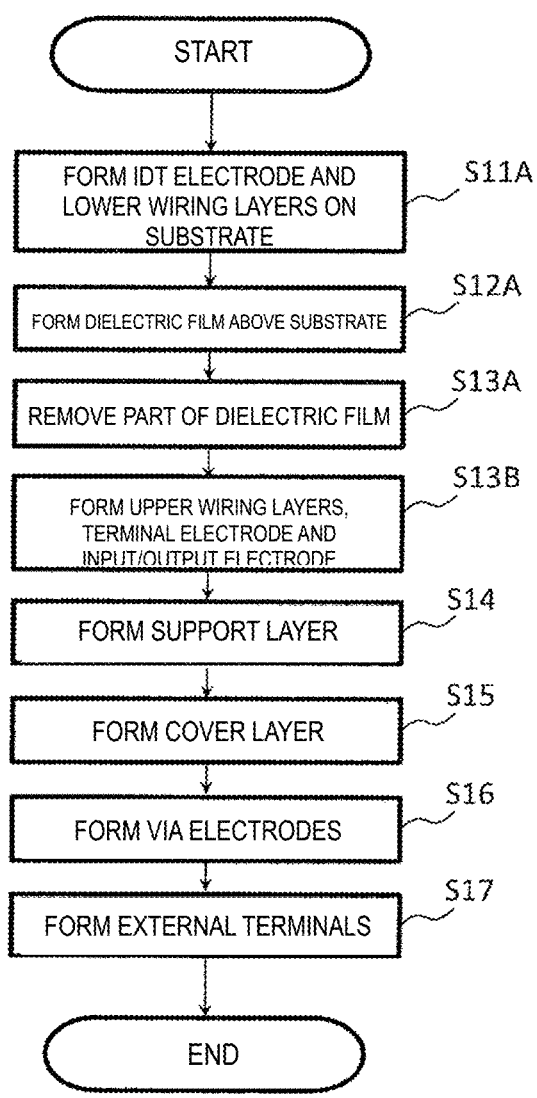
FIG. 9 is a flowchart illustrating a method for manufacturing a filter device according to a Modification 1 of a preferred embodiment of the present invention.

A non-limiting example of a method for manufacturing a filter device 1 according to a Modification 1 of the preferred embodiment will be described with reference to FIGS. 9 and 10A to 10D. FIG. 9 is a flowchart illustrating a method for manufacturing the filter device 1 of the Modification 1. FIGS. 10A to 10D are views schematically illustrating a portion of the method for manufacturing the filter device 1 of the Modification 1. In the Modification 1, a case where a LiNbO$_3$ piezoelectric substrate is used as the substrate 50 is described. In the Modification 1, of the first filter 10 and the second filter 20, the first filter 10 is taken as an example to describe the method for manufacturing the filter device 1.

Figure 10A:
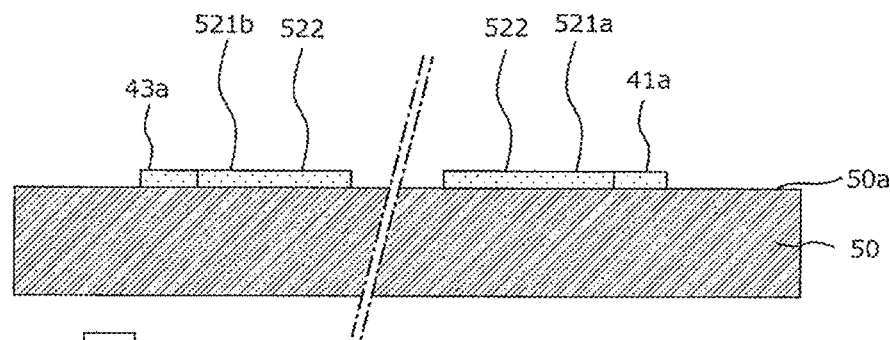
FIGS. 10A to 10D are views schematically illustrating a portion of the method for manufacturing the filter device according to the Modification 1 of the preferred embodiment of the present invention.

As illustrated in FIG. 10A, the IDT electrodes 52 and lower wiring layers 41a and 43a are formed on the substrate 50 (S11A). The lower wiring layer 41a is a portion having a thickness included in the thickness of the wiring electrode 41. The lower wiring layer 43a is a portion having a thickness included in the thickness of the wiring electrode 43.

Figure 10B:
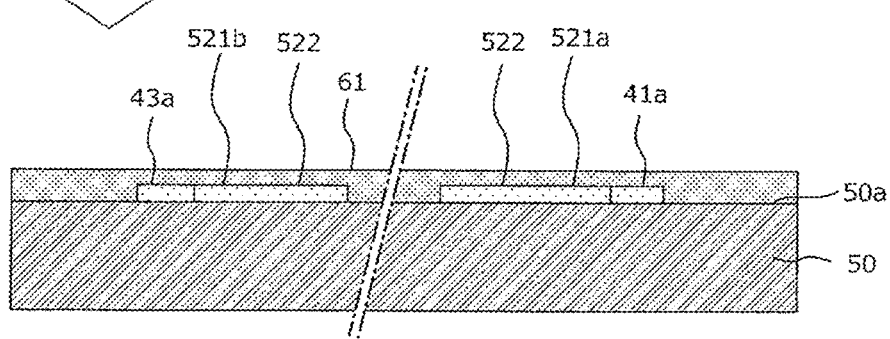

As illustrated in FIG. 10B, the dielectric film 61 is subsequently formed above the entire surface of the main surface 50a of the substrate 50 so as to cover the IDT electrodes 52 and the lower wiring layers 41a and 43a (S12A). The dielectric film 61 is formed, for example, by spattering or vapor deposition.

Figure 10C:
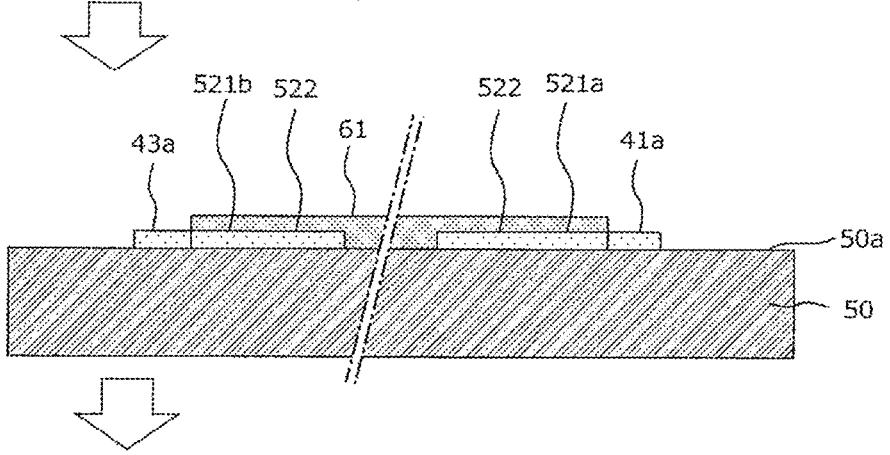
Figure 10D:
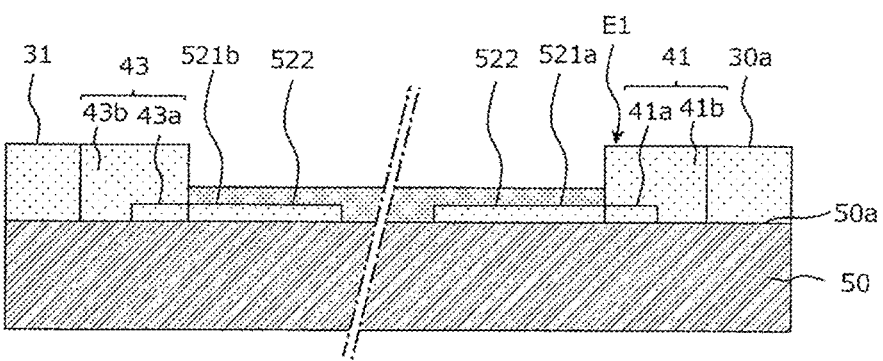

As illustrated in FIG. 10C, a portion of the dielectric film 61 formed above the substrate 50 is subsequently removed (S13A). Specifically, etching is performed to remove the following portions of the dielectric film 61: where upper wiring layers 41b and 43b are to be formed; and where the terminal electrode 30a and the input/output electrode 31 are to be formed. Note that the upper wiring layer 41b is a portion constituting the remaining thick portion of the wiring electrode 41. The upper wiring layer 43b is a portion defining the remaining thick portion of the wiring electrode 43. The upper wiring layers 41b and 43b are thicker than the lower wiring layers 41a and 43a.

Subsequently, the upper wiring layers 41b and 43b, the terminal electrode 30a, and the input/output electrode 31 are respectively formed in areas corresponding to the removed portions of the dielectric film 61 (S13B). The exposed portion E1 of the wiring electrode 41 is thus formed. An exposed portion is also formed on the wiring electrode 43.

Subsequently, the support layer 65 is formed on the substrate 50 in the same or substantially the same manner as in the above-described preferred embodiment (S14), and the cover layer 66 is formed on the support layer 65 (S15). In addition, the plurality of via electrodes 67 are formed in the support layer 65 and the cover layer 66 (S16), and the external terminals are formed on the plurality of via electrodes 67 (S17). The filter device 1 of the Modification 1 is formed in a process represented by these steps S11A to S17 in FIG. 9. Note that the first filter 10 is taken as an example in the description above, but the second filter 20 is also formed in the same or substantially the same manner.

6. Modification 2

A filter device 1 according to a Modification 2 of the present preferred embodiment will be described with reference to FIG. 11. An acoustic wave device of the Modification 2 is different from the acoustic wave device of above-described preferred embodiment using a surface acoustic wave in that the acoustic wave device of the Modification 2 is a piezoelectric thin-film resonator using thickness extensional vibration of a bulk wave.

Figure 11:
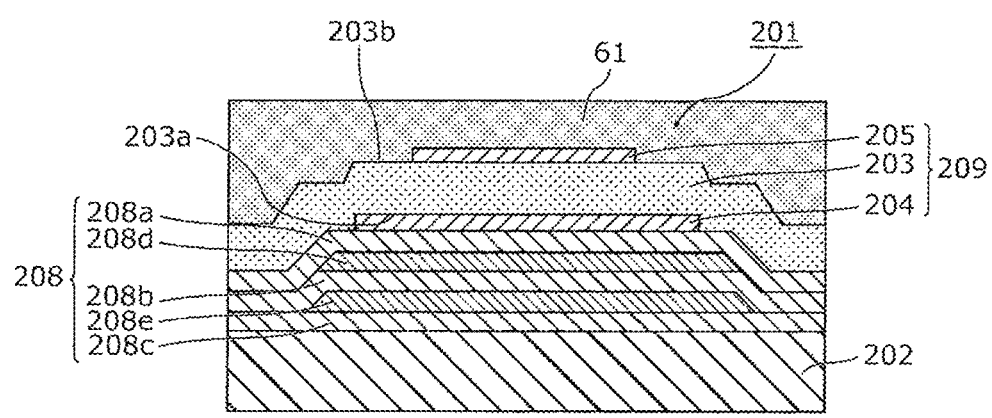
FIG. 11 is a view schematically illustrating an acoustic wave device of a filter device according to a Modification 2 of a preferred embodiment of the present invention.

FIG. 11 is a view schematically illustrating an acoustic wave device 201 of the filter device 1 according to the Modification 2.

As illustrated in FIG. 11, in a portion where the acoustic wave device 201 is provided, an acoustic reflex layer 208, a stacked thin-film portion 209, and the dielectric film 61 are stacked in this order above a substrate 202.

The dielectric film 61 is a protective film preferably including, for example, silicon dioxide as a main ingredient and covers the other electrode layer 205 (described later) and a piezoelectric layer 203. Note that the dielectric film 61 may be a protective film including silicon nitride as a main ingredient or may be a protective film including aluminum nitride as a main ingredient.

The acoustic reflex layer 208 includes first acoustic impedance layers 208a to 208c and second acoustic impedance layers 208d and 208e that are alternately stacked, the first acoustic impedance layers 208a to 208c being made of a material having relatively low acoustic impedance, the second acoustic impedance layers 208d and 208e being made of a material having relatively high acoustic impedance. That is, the acoustic impedance layers 208a to 208e are stacked in a direction from a piezoelectric vibration portion (described later) to the substrate 202 in the order of the first acoustic impedance layer 208a, the second acoustic impedance layer 208d, the first acoustic impedance layer 208b, the second acoustic impedance layer 208e, and the first acoustic impedance layer 208c.

The first acoustic impedance layers 208a to 208c and the second acoustic impedance layers 208d and 208e may be made of an appropriate inorganic material or an appropriate organic material.

For example, the first acoustic impedance layers 208a to 208c may be made of an inorganic material such as $SiO_2$ or SiOC or an organic material such as a high polymer material such as benzocyclobutene (BCB) or polyimide. As the material of the second acoustic impedance layers 208d and 208e, a metal such as W, Ir, Pt, or Mo, an inorganic compound such as AlN, SiN, $Al_2O_3$, or $Ta_2O_5$ or an appropriate organic material may be used.

The stacked thin-film portion 209 is stacked on the acoustic reflex layer 208. The stacked thin-film portion 209 includes the piezoelectric layer 203 having a polarization axis aligned in the thickness direction, one electrode layer 204 disposed on a side closer to a lower surface 203a of the piezoelectric layer 203 than to an upper surface 203b of the piezoelectric layer 203 (on the side closer to the acoustic reflex layer 208), and the other electrode layer 205 disposed on a side closer to the upper surface 203b of the piezoelectric layer 203. In the acoustic wave device 201, changing the thickness of the one electrode layer 204 or the other electrode layer 205 enables a resonance frequency to be changed.

The piezoelectric layer 203 is preferably made of, for example, an appropriate piezoelectric single crystal or an appropriate piezoelectric ceramic exhibiting piezoelectricity. As such a piezoelectric material, for example, AlN, ZnO, $LiNbO_3$, $LiTaO_3$, $KNbO_3$, a PZT-based piezoelectric ceramic, or other materials may be used.

Each of the one electrode layer 204 and the other electrode layer 205 is made of an appropriate conductive material. As such a conductive material, an appropriate metal such as, for example, Al, Pt, Au, Mo, W, Ti, Cr, Cu, Ru, Ir, or Ta or an alloy including any of these metals may be used. The one electrode layer 204 and the other electrode layer 205 may also include metal films including any of these metals or the alloy that are stacked.

In the Modification 2, the piezoelectric vibration portion is disposed in a portion where the one electrode layer 204 and the other electrode layer 205 overlap each other with the piezoelectric layer 203 interposed therebetween. When an alternating electric field is applied to the one electrode layer 204 and the other electrode layer 205, the electric field is applied to the piezoelectric vibration portion, and the piezoelectric vibration portion is excited. This provides resonance characteristics utilizing energy-trapped thickness extensional vibration.

The filter device 1 according to the Modification 2 includes the substrate 202 having piezoelectricity, the first filter 10 including the acoustic wave device 201 disposed on the substrate 202, the terminal electrode 30a disposed on the substrate 202, the first wiring electrode 41 disposed on the substrate 202 and connecting the first filter 10 and the terminal electrode 30a, and the dielectric film 61 disposed above the substrate 202 so as to cover the acoustic wave device 201. At least a portion of the first wiring electrode 41 is not covered with the dielectric film 61 and is exposed. As described above, exposing the first wiring electrode 41 connected to the terminal electrode 30a reduces or prevents current flow from being obstructed in the first wiring electrode 41. This reduces or prevents the occurrence of an IMD and a harmonic wave distortion in the filter device 1 of Modification 2.

The filter device 1 according to the above-described preferred embodiment of the present invention has heretofore been described. However, the present invention is not limited to the above-described preferred embodiment. For example, preferred embodiments of the present invention may include modifications as described below.

For example, FIG. 4B illustrates the state where at least a portion of each of the wiring electrodes 41 and 42 is exposed. However, the state is not limited to this, and the entirety or substantially the entirety of each of wiring electrodes 41 and 42 may be exposed in a plan view.

For example, the acoustic wave devices according to preferred embodiments of the present invention are not limited to a surface acoustic wave resonator and may be a boundary acoustic wave resonator.

For example, a multiplexer connecting the plurality of transmission/reception filters together is described as an example of the filter device in the description for the above-described preferred embodiment. However, the filter device 1 may be a duplexer connecting a transmission filter and a reception filter together or may be a multiplexer connecting a plurality of reception filters together.

For example, the above-described preferred embodiment is not limited to communication equipment for WiFi and is applicable to a GPS multiplexer that multiplexes a GPS signal and a signal in the cellular band, a quadplexer in combination of Band 25 with Band 66 duplexers or Band 1 with Band 3 duplexers, and a multiplexer having an increased number of connected filters.

As filter devices each applicable to frequency standards having multiband and multimode requirements, preferred embodiments of the present invention can be widely used for communication equipment such as mobile phones, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
   a substrate having piezoelectricity;
   a first filter including an IDT electrode disposed on the substrate;
   a terminal electrode disposed on the substrate;
   a first wiring electrode disposed on the substrate and connecting the first filter and the terminal electrode;
   a dielectric film disposed above the substrate to cover the IDT electrode in the first filter;
   a second filter disposed on the substrate and including an IDT electrode different from the IDT electrode in the first filter; and
   a second wiring electrode disposed on the substrate and connecting the second filter and the terminal electrode; wherein
   at least a portion of the first wiring electrode is not covered with the dielectric film;
   the IDT electrode in the second filter is covered with the dielectric film, and at least a portion of the second wiring electrode is not covered with the dielectric film; and the portion of the first wiring electrode, the portion of the second wiring electrode, and the terminal electrode are surrounded by the dielectric film.

2. The filter device according to claim 1, wherein a portion of the first wiring electrode and a portion of the second wiring electrode that are not covered with the dielectric film, respectively, are in contact with an air layer.

3. The filter device according to claim 2, wherein
   a cover layer is disposed above the first wiring electrode and the second wiring electrode; and
   the air layer is disposed between the cover layer and the first wiring electrode and between the cover layer and the second wiring electrode.

4. The filter device according to claim 1, wherein the terminal electrode is not covered with the dielectric film and is connected to an antenna terminal.

5. The filter device according to claim 1, wherein an entirety or substantially an entirety of each of the first wiring electrode and the second wiring electrode is not covered with the dielectric film.

6. The filter device according to claim 1, wherein each of the IDT electrode in the first filter and the IDT electrode in the second filter has a comb shape and includes a plurality of electrode fingers and a busbar electrode connected to the plurality of electrode fingers.

7. The filter device according to claim 1, wherein the dielectric film includes silicon oxide.

8. A filter device comprising:
   a substrate having piezoelectricity;
   a first filter including an acoustic wave device disposed on the substrate;
   a terminal electrode disposed on the substrate;
   a first wiring electrode disposed on the substrate and connecting the first filter and the terminal electrode;
   a dielectric film disposed above the substrate to cover the acoustic wave device in the first filter;
   a second filter disposed on the substrate and including an acoustic wave device different from the acoustic wave device in the first filter; and
   a second wiring electrode disposed on the substrate and connecting the second filter and the terminal electrode; wherein
   at least a portion of the first wiring electrode is not covered with the dielectric film;
   the acoustic wave device in the second filter is covered with the dielectric film, and at least a portion of the second wiring electrode is not covered with the dielectric film; and the portion of the first wiring electrode, the portion of the second wiring electrode, and the terminal electrode are surrounded by the dielectric film.

9. The filter device according to claim 8, wherein an entirety or substantially an entirety of each of the first wiring electrode and the second wiring electrode is not covered with the dielectric film.

10. The filter device according to claim 9, wherein the dielectric film includes silicon oxide.

11. The filter device according to claim 8, wherein the terminal electrode is not covered with the dielectric film and is connected to an antenna terminal.

* * * * *